United States Patent [19]

Leung

[11] Patent Number: 5,615,169
[45] Date of Patent: Mar. 25, 1997

[54] METHOD AND STRUCTURE FOR CONTROLLING INTERNAL OPERATIONS OF A DRAM ARRAY

[75] Inventor: Wingyu Leung, Cupertino, Calif.

[73] Assignee: Monolithic System Technology, Inc., San Jose, Calif.

[21] Appl. No.: 522,032

[22] Filed: Aug. 31, 1995

[51] Int. Cl.⁶ ..................................................... G11C 7/00
[52] U.S. Cl. ....................... 365/233.5; 365/201; 365/207; 365/190
[58] Field of Search .................................. 365/233, 233.5, 365/203, 207, 190, 149, 201

[56] References Cited

U.S. PATENT DOCUMENTS

| | | | |
|---|---|---|---|
| 4,924,443 | 5/1990 | Mattausch | 365/203 |
| 5,029,135 | 7/1991 | Okubo | 365/203 |
| 5,287,327 | 2/1994 | Takasugi | 365/233.5 X |

Primary Examiner—Joseph A. Popek
Attorney, Agent, or Firm—Skjerven, Morrill, MacPherson, Franklin & Friel; Norman R. Klivans; E. Eric Hoffman

[57] ABSTRACT

A method and structure for controlling the timing of an access to a DRAM array in response to a row access (RAS#) signal and the rising and falling edges of a clock signal. Row address decoding and the deactivation of equalization circuits are initiated when the row access signal is received and a rising edge of the clock signal is detected. The row address decoding and the deactivation of the equalization circuits are completed before the falling edge of the clock signal occurs. The falling edge is then used to initiate the turning on of the sense amplifiers of the DRAM array. The sense amplifiers are turned on before the subsequent rising edge of the clock signal. The subsequent rising edge is then used to initiate the column address decoding operation of the DRAM array. A test mode is included which allows the DRAM array to be operated asynchronously for testing purposes.

23 Claims, 3 Drawing Sheets

METHOD AND STRUCTURE FOR CONTROLLING INTERNAL OPERATIONS OF A DRAM ARRAY

BACKGROUND OF THE INVENTION

1. Field of the Invention

The present invention relates to the operation of a dynamic random-access memory (DRAM) array. More specifically, the present invention relates to a method and structure for using a synchronous clock signal to control internal operations of a DRAM array.

2. Description of the Prior Art

Conventional DRAM arrays can be generally classified as being either asynchronous or synchronous. Asynchronous DRAM arrays do not use a system clock signal to control data flow to and from the array. Synchronous DRAM (SDRAM) arrays, such as the array described in Samsung's, 4Mx4 Synchronous Dynamic Random Access Memory data sheet, use a system clock signal to control data flow. Both asynchronous and synchronous DRAM arrays use a two step external operation to access the DRAM array. Each two step external operation includes a row access operation and a column access operation. The row access operation is initiated when a row access (RAS#) signal is asynchronously asserted (in an asynchronous DRAM array), or when a row access or activate command is executed (in an SDRAM array). After the row access operation is initiated, a row address is latched in the DRAM array and the data values in the selected row are loaded into a bank of sense amplifiers. The column access operation is initiated when a column access (CAS#) signal is asserted (in an asynchronous DRAM array), or when a column access command is executed (in an SDRAM array). After the column access operation is initiated, a column address is latched in the DRAM array and the data value in the selected column (sense amplifier) is accessed.

FIG. 1 is a schematic diagram of a portion of a conventional DRAM array 100. DRAM array 100 includes bit lines 1 and 2, word lines 11 and 12, memory cell transistors 21–22, memory cell capacitors 23–24, equalization line 15, equalization transistor 16, sense amplifier control lines 31–34, column switch line 35, data lines 36–37, sense amplifier transistors 40–45, column select transistors 46–47, and sense amplifier equalization transistor 51. Transistor 21 and capacitor 23 form memory cell 61 and transistor 22 and capacitor 24 form memory cell 62 as illustrated. Transistors 41–44 are connected to form regenerative latches which are used as sense amplifier 50. Sense amplifier 50 is coupled to voltage supplies $V_{CC}$ and ground through transistors 40 and 45, respectively.

A conventional row access operation directed toward memory cell 61 is initiated by asserting a RAS# signal. After the RAS# signal is asserted, there are a sequence of events that must occur within DRAM array 100 to successfully load the data value stored in memory cell 61 and reference cell 62 into sense amplifier 50. First, the row address must be decoded. Second, bit line equalization transistor 16 (which is normally turned on) must be turned off. Third, the selected word line 11 or 12 must be turned on. Fourth, sense amplifier 50 must be turned on. In DRAM array 100 (whether synchronous or asynchronous) the row access operation is initiated and executed as a single event in response to the RAS# signal. As a result, each of the four critical events described above must be performed in a self-timed fashion. Thus, upon receiving the RAS# signal, a delay chain launches each of the four critical events sequentially, without an external timing reference. The four critical events are described in more detail below.

The row address decoding step is performed by conventional row decoding circuitry (not shown) in response to the RAS# signal and a row address received by DRAM array 100.

When DRAM array 100 is not being accessed, bit lines 1 and 2 are equalized to a voltage equal to half of supply voltage $V_{CC}$ of DRAM array 100. This equalization is performed by asserting an equalization signal EQ on equalization line 15. The asserted equalization signal EQ causes equalization transistor 16 to turn on, thereby connecting bit lines 1 and 2, and forcing these bit lines 1 and 2 to approximately the same voltage. Before equalization transistor 16 is turned on, one of bit lines 1 and 2 is at $V_{CC}$ and the other one of bit lines 1 and 2 is at ground. Since the capacitance of bit lines 1 and 2 are approximately the same, bit lines 1 and 2 are equalized at a voltage equal to one half of supply voltage $V_{CC}$ when transistors 40 and 45 are turned off and equalization transistor 16 is turned on. After the RAS# signal is received, equalization transistor 16 is turned off by de-asserting the equalization signal EQ in a self-timed manner.

After equalization transistor 16 is turned off, one of word lines 11 or 12 is turned on by asserting the respective word line signal WL0 or WL1. For example, to access memory cell 61, word line signal WL0 is turned on, while word line signal WL1 remains off. Word line signal WL0 is asserted in a self-timed manner with respect to the RAS# signal. For the charge stored in cells 61 to be accurately provided to bit line 1, equalization transistor 16 must be turned off before word line 11 is turned on. When word line signal WL0 is asserted, cell transistor 21 is turned on, thereby transferring the charge stored in capacitor 23 to bit line 1. If memory cell 61 is in a charged state, the charge transfer causes the bit line signal BL on bit line 1 to have a slightly higher voltage than the bit line signal BL# on bit line 2. The larger the voltage difference between bit lines 1 and 2 before sense amplifier 50 is activated, the greater the chance that sense amplifier 50 will be able to sense the data value correctly within a shorter time period. Therefore, it is important that the differential voltage between bit lines 1 and 2 be fully developed before sense amplifier 50 is activated.

After word line 11 is turned on, sense amplifier 50 is turned on by asserting a logic low sense amplifier enable signal SA# on sense amplifier control line 31 and a logic high sense amplifier enable signal SA on sense amplifier control line 32. Sense amplifier 50 is turned on in a self-timed manner with respect to the RAS# signal. Sense amplifier enable signals SA and SA# turn on respective transistors 45 and 40, thereby applying supply voltages $V_{CC}$ and ground to sense amplifier 50. When DRAM array 100 is not being accessed, sense amplifier equalization transistor 51 is turned on, thereby connecting sense amplifier control lines 33 and 34 and assuring that sense amplifier 50 is reset prior to a memory access. When sense amplifier 50 is to be accessed, sense amplifier equalization transistor 51 is turned off, thereby disconnecting control lines 33 and 34, and enabling sense amplifier 50.

Prior art schemes use delay elements which allow the previously described signals to be generated at the desired intervals after the RAS# signal is received. These delay elements thereby provide the self-timing necessary to launch the four critical events. Thus, when DRAM array 100 is used in a system having a system clock signal, the data access time of DRAM memory 100 is independent of the frequency of this system clock signal. This behavior is advantageous for systems that require a relatively constant memory access time when operated over various clock frequencies. The main drawback of the previously described self-timed mode of operation, however, is that the delay elements used are subject to process, temperature and supply voltage variations. Therefore, to guarantee reliable operation over a wide range of operating conditions, the four critical events must be separated by safe timing margins, resulting in overall longer delay and slower operating speed for DRAM array 100.

It would therefore be desirable to have a structure and method for performing row access operations in a DRAM array in a manner which is faster than conventional self-timed row access operations. It would also be desirable if such a structure and method were not subject to process, temperature and supply voltage variations. It would further be desirable if such a DRAM array were capable of operating in an asynchronous manner at low frequencies for testing purposes.

SUMMARY

In accordance with the present invention, a system clock signal is used to initiate the activation and de-activation of selected word lines, sense amplifiers, and column switches of a DRAM array, thereby eliminating the timing uncertainties introduced by the delay elements of prior art DRAM accessing schemes.

One embodiment includes a method of operating a DRAM array in response to a system clock signal and a row access signal. The row access signal is asserted to initiate an access to the DRAM array. During each rising edge of the system clock signal, the status of the row access signal is determined. If the row access signal has been asserted and a rising edge of the system clock signal occurs, a row address decoding operation is initiated and a bit line and sense amplifier equalization transistors are turned off. These operations are carried out in parallel, such that the bit line and sense amplifier equalization transistors are turned off before the word line of the addressed row is turned on.

Upon detecting the subsequent falling edge of the clock signal, the sense amplifiers are turned on. The row address decoding operation is completed and the bit line and sense line equalization transistors are turned off before the falling edge of the clock signal occurs. When the sense amplifiers are turned on, the data values from the addressed row of memory cells are stored in the sense amplifiers.

Upon detecting the next rising edge of the clock signal, the column address decoding operation is initiated. When the column address decoding operation is complete, data values are read from the sense amplifiers out of the DRAM array.

In one variation of the above-described method, the clock signal is a system clock signal. In another variation, the clock signal is generated by a phase locked loop circuit in response to a system clock signal. In this variation, the edges of the clock signal can have a predetermined phase relationship with respect to the edges of the system clock signal.

Because the access operations of the DRAM array are performed in response to the system clock signal, the access time of the DRAM memory of the present invention is clock frequency dependent. However, in state-of-the-art computer systems, this is not a problem because the data access time of the computer system is given in units of clock cycles with little dependence on the frequency of the system clock. For example, memory access time in a typical Pentium PC system is usually fixed at 3 or 4 clock cycles.

In an alternative embodiment, the above-described method includes a test mode in which the DRAM array is operated asynchronously. A test signal is asserted to enable the test mode. Such a test mode is important for wafer sort testing when the wafer sort environment necessitates low frequency operations (e.g., less than 10 Mhz). In the test mode, the row address decoding operation, the turning off of the bit line and sense amplifier transistors, the sense amplifier enabling operation, and the column address decoding operation are initiated in a self-timed manner, independent of the clock signal. This allows the DRAM array to be tested at a reasonable functional speed independent of clock frequency.

The present invention also includes a control circuit for synchronously accessing a DRAM memory array. This control circuit includes a first signal generation circuit which generates a signal which turns off the bit line and sense amplifier equalization transistors when the row access signal is asserted and a rising edge of the clock signal occurs. The control circuit also includes a second signal generation circuit which generates sense amplifier control signals when the row access signal is asserted and a subsequent falling edge of the clock signal occurs. The sense amplifier control signals enable the sense amplifiers.

The present invention will be more fully understood in light of the following detailed description taken together with the drawings.

DETAILED DESCRIPTION OF THE INVENTION

Figure 1:
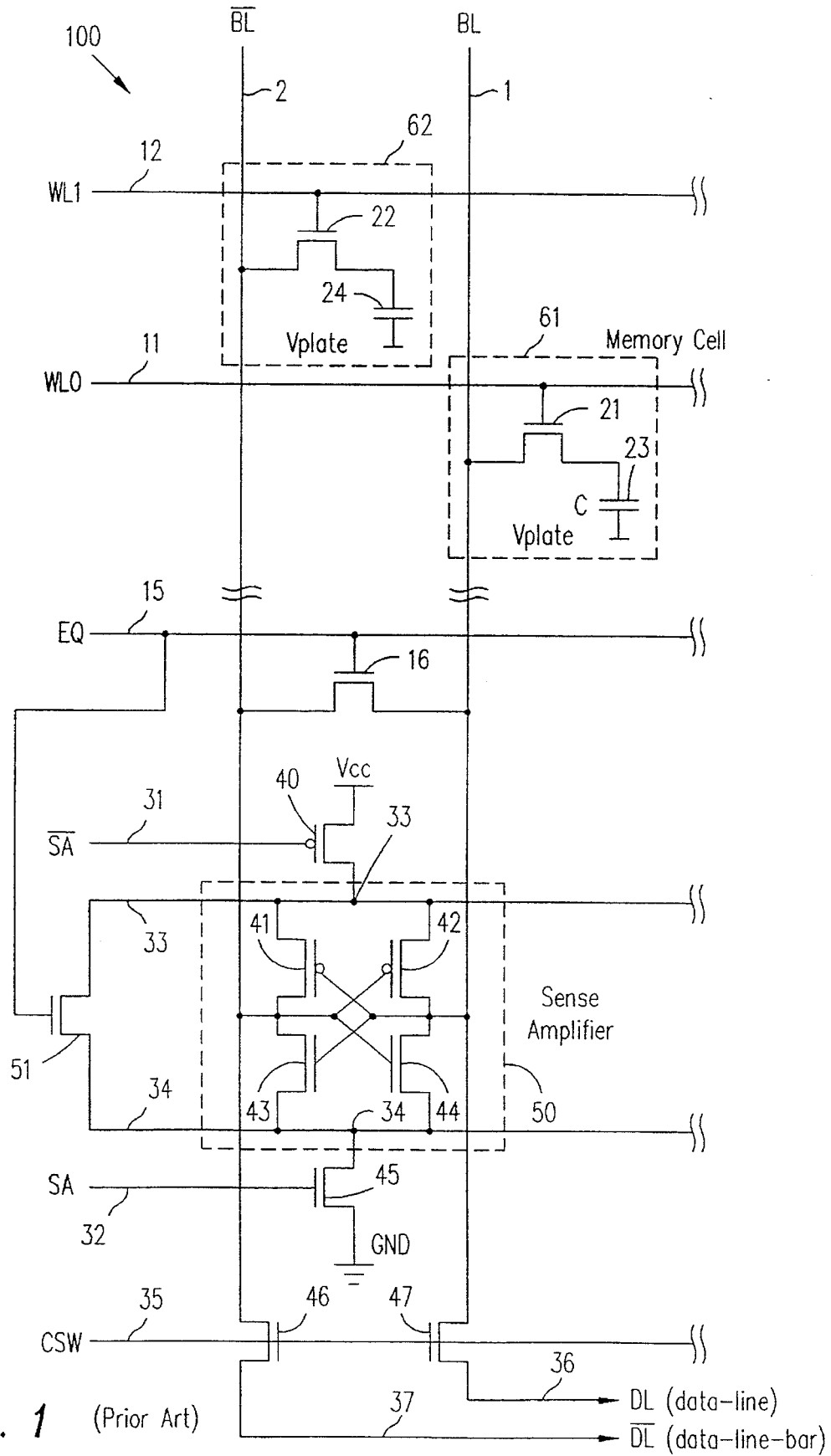
FIG. 1 is a schematic diagram of a portion of a conventional DRAM array.
Figure 2:
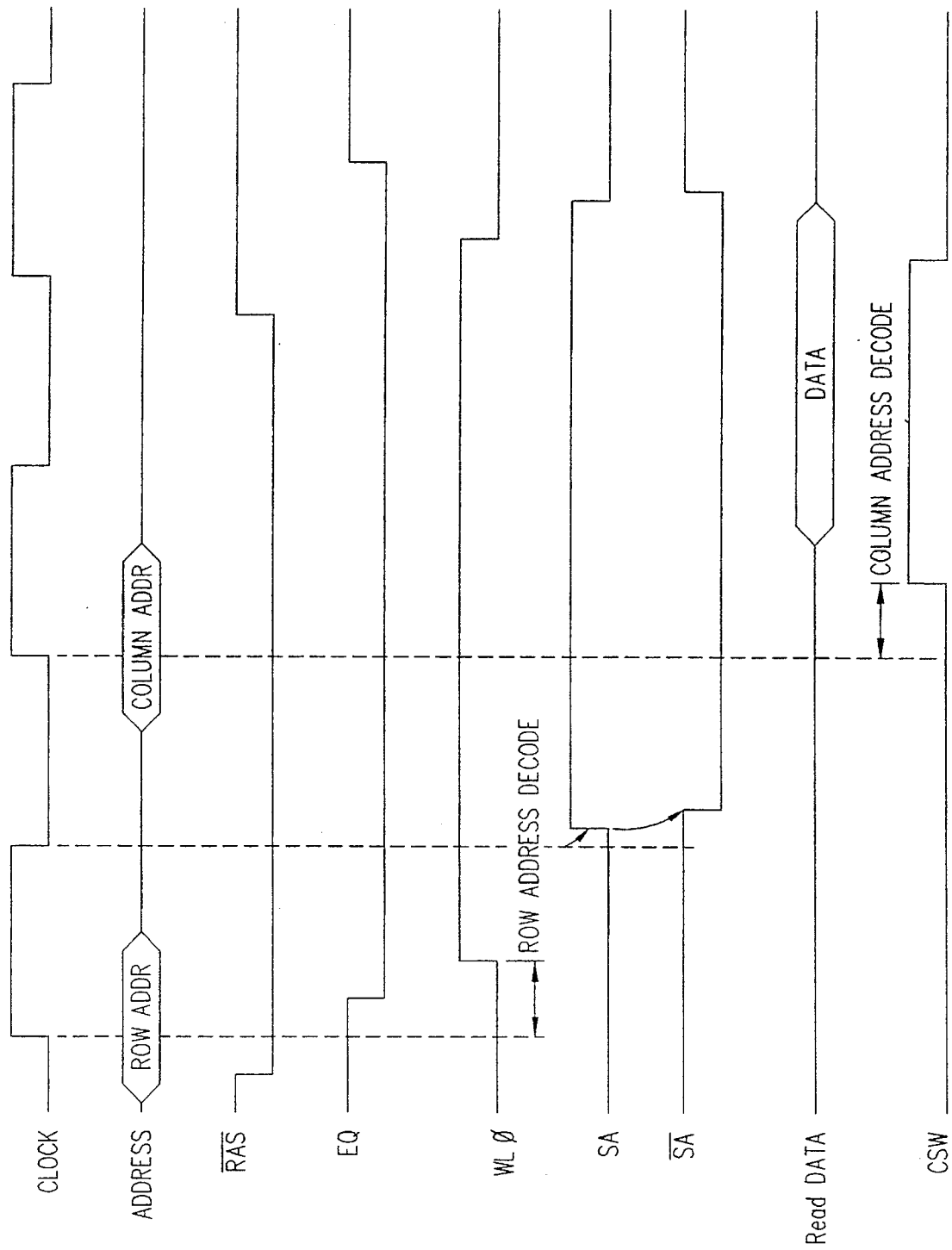
FIG. 2 is a timing diagram illustrating the control of the DRAM array of FIG. 1 in accordance with one embodiment of the invention.

FIG. 2 is a timing diagram illustrating control signals which are used to control DRAM array 100 (FIG. 1) in accordance with one embodiment of the invention. In this embodiment, a system clock signal is used to control the timing of internal operations of DRAM array 100. Specifically, the edges of the system clock signal are used to launch critical internal operations. In another variation, a phase-locked-loop circuit is used to buffer the system clock signal, thereby providing a high-quality clock signal which has a good duty cycle (i.e., even high and low half cycles). The phase-locked-loop circuit can also provide a signal having edges with pre-determined phase relationships for launching different internal events at times other than during the rising and falling edges of the system clock signal.

In the present embodiment, DRAM array 100 is implemented in a high-speed system in which the system clock signal has a frequency of 66 to 100 MHz. In such an embodiment, a row access operation is executed in two cycles of the system clock signal. As described in more detail below, a rising edge of the system clock signal initiates the steps of row address decoding, turning off bit line equalization transistor 16, turning off sense amplifier equalization transistor 51, and turning on word line 11 or 12. The subsequent falling edge of the system clock signal initiates the turning on of sense amplifier 50 (by turning on transistors 40 and 45). The subsequent rising edge of the system clock signal initiates the column address decoding. Data is written to memory cell 61 or 62 or provided to data lines 36 and 37 before the next rising clock edge.

In this method, most of the timing budget of the DRAM memory access (i.e., two periods of the system clock signal) is expended on two time intervals. The first time interval is the time which elapses between the turning on of word line 11 or 12 and the turning on of sense amplifier 50. The second time interval is the time which elapses between the turning on of sense amplifier 50 and the column access operation (i.e., connecting sense amplifier 50 to data lines 36 and 37). These first and second time intervals are two critical timing parameters in the operation of DRAM array 100.

FIG. 2 shows the relative timing of the control signals in DRAM array 100 during a read operation of memory cell 61. The RAS# signal is a control signal which is generated external to DRAM array 100. The RAS# signal is asserted (at a logic low voltage level) to signal the arrival of a new memory access. The RAS# signal is de-asserted (at a logic high voltage level) to signal the end of the current memory access. Internally, DRAM array 100 uses the rising edge of the system clock signal to sample the RAS# signal. When DRAM array 100 detects that the RAS# signal has been asserted low (during a rising edge of the system clock signal), the normally high equalization signal on equalization line 15 is driven to a logic low voltage level, thereby turning off bit line equalization transistor 16 and sense amplifier equalization transistor 51.

The operation of turning off equalization transistors 16 and 51 is performed in parallel with the latching and decoding of the row address. Upon completion of the row address decoding, word line signal WL0 is asserted high, thereby turning on word line 11. The turning off of equalization transistors 16 and 51 is completed before word line 11 is turned on. After word line 11 is turned on, the charge stored in capacitor 23 of memory cell 61 causes a voltage to be developed on bit line 1 and creates a voltage differential between bit lines 1 and 2.

The row address decoding operation, the turning off of equalization transistors 16 and 51, and the turning on of word line 11, are each completed before the subsequent falling edge of the system clock signal. Sense amplifier enable signals SA and SA# are activated (i.e., SA is asserted high and SA# is asserted low) when DRAM array 100 detects the subsequent falling edge of the system clock signal. In one embodiment, sense amplifier enable signal SA# is activated approximately 2 nanoseconds after sense amplifier signal SA has been activated to reduce the amount of current that may flow directly between the $V_{CC}$ and ground voltage supplies. In another embodiment, sense amplifier enable signals SA and SA# can be activated simultaneously. The activation of sense amplifier 50 causes the data value on bit lines 1 and 2 to be latched in sense amplifier 50.

The column address decoding operation is initiated by the next rising edge of the system clock signal. When the column address decoding operation is completed, a column switch signal CSW is asserted high on line 35, thereby turning on transistors 46 and 47. As a result, sense amplifier 50 is connected to data lines 36 and 37, thereby transporting the addressed data to the I/O driver (not shown) of DRAM array 100.

At completion of data access, the RAS# signal is de-asserted high. At the next rising edge of the system clock signal, the high RAS# signal is detected. Each of the following operations are initiated when this high RAS# signal is detected. First, word line signal WL0 is de-asserted low, thereby turning off word line 11. Next, sense amplifier 50 is turned off by de-asserting the sense amplifier control signals SA (low) and SA# (high) provided to respective sense amplifier control lines 32 and 31. After sense amplifier 50 is turned off, the equalization signal 15 transitions to a high state, thereby turning on bit line equalization transistor 16 and sense amplifier equalization transistor 51.

The previously described internal operations of DRAM array 100 can be controlled using the system clock signal because of the stability of the system clock signal. In most modern microprocessor systems, the system clock signal is derived from a crystal oscillator which provides a stable signal over a wide range of supply voltages and operating temperatures. When the system clock signal has a high frequency (e.g., greater than 60 MHz for a 0.6 μm DRAM process), the previously described method allows DRAM array 100 to operate faster than if prior art delay chains were used to initiate the internal operation of DRAM array 100. This is because the delay chains must provide an extra amount of delay to compensate for temperature and process variations which may cause inaccuracies in the amount of delay introduced by the delay chain.

Another advantage of the present invention over prior art DRAM devices is that, because the critical internal timing is controlled by an external system clock, the device has a wider operating margin when operated at lower frequencies. Any weak memory cell, which normally would result in slower sensing time, and therefore may fail in a traditional self-timed sensing configuration, may operate successfully when operated in response to a system clock signal having a lower frequency.

Figure 3:
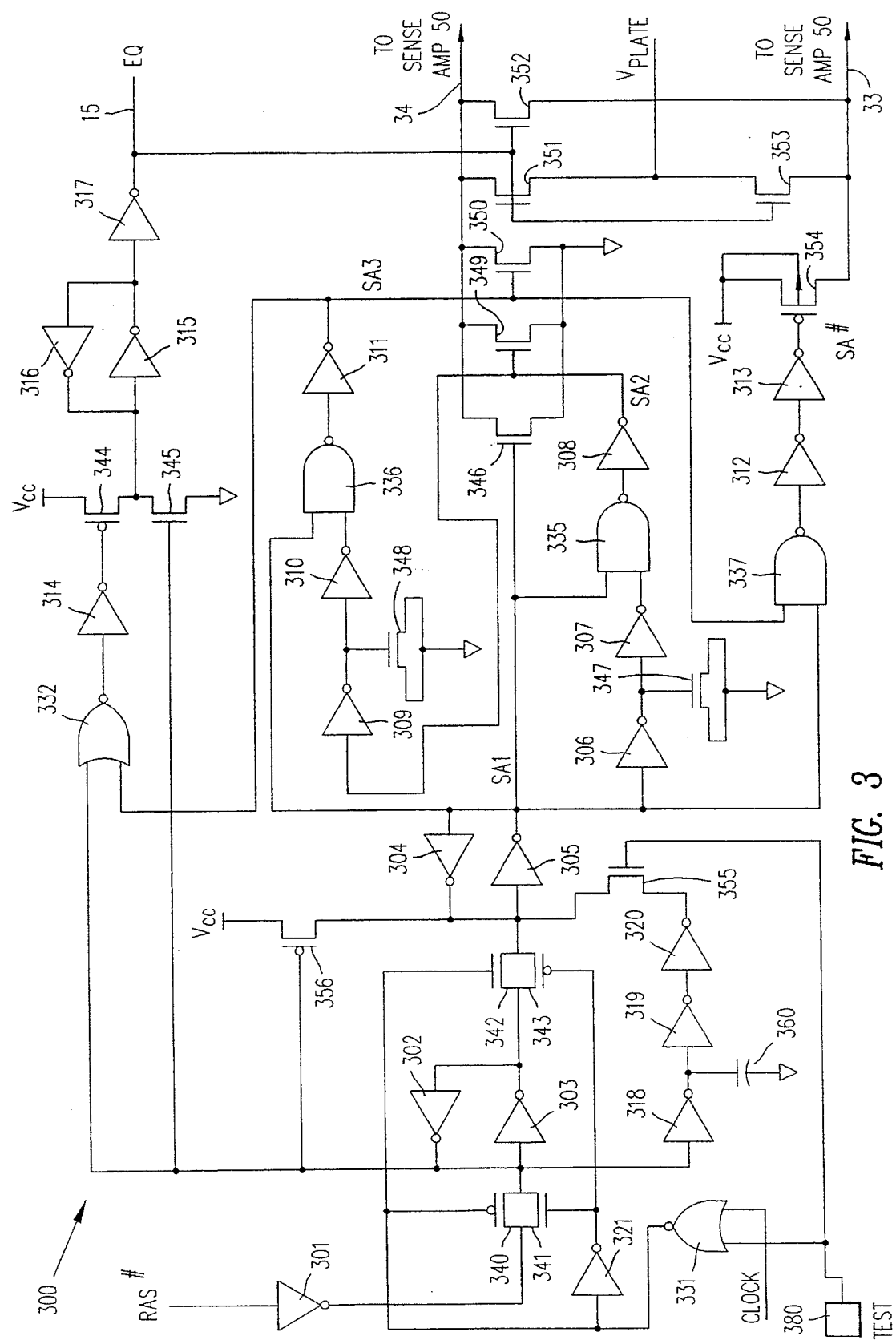
FIG. 3 is a schematic diagram of a control circuit used to control the DRAM array of FIG. 1 in accordance with one embodiment of the invention.

FIG. 3 is a schematic diagram of a control circuit 300 used to control the internal operations of DRAM array 100 in accordance with one embodiment of the invention. Control circuit 300 includes inverters 301–321, NOR gates 331–332, NAND gates 335–337, transistors 340–356 and capacitor 360. Control circuit 300 receives the RAS# signal and the system clock signal, and in response, deactivates equalization signal EQ and activates sense amplifier control signals SA and SA#. Sense amplifier control signal SA is generated as a series of three sense amplifier control signals SA1, SA2 and SA3. Sense amplifier control signals SA1, SA2 and SA3 are provided to transistors 346, 349 and 350, respectively, which together are equivalent to transistor 45 of DRAM array 100 (FIG. 1). Thus, when transistors 346, 349 and 350 are turned on, sense amplifier 50 is coupled to ground through these transistors. The SA# signal is provided to transistor 354, which operates in a manner equivalent to transistor 40 of DRAM array 100 (FIG. 1). Thus, when transistor 354 is turned on, sense amplifier 50 is coupled to the $V_{CC}$ supply voltage through transistor 354. Control circuit 300 operates as follows.

During normal operation, the TEST signal has a logic low value. The TEST signal is described in more detail below in connection with a low frequency testing alternative. Thus, during normal operation, the system clock signal is passed through NOR gate 331 and invertor 321 and provided to the gates of n-channel pass transistor 341 and p-channel pass transistor 343. The inverse of the system clock signal is passed through NOR gate 331 and provided to the gates of p-channel pass transistor 340 and n-channel pass transistor 342. The RAS# signal is inverted by invertor 301 and the resulting signal is provided to pass transistors 340 and 341.

When the system clock signal has a logic high value (beginning with the rising edge of the system clock signal), the inverse of the RAS# signal is passed to the latch formed by inverters 303 and 302. If the RAS# signal has a logic low value, a logic high value is stored in this latch. Because the system clock signal has a logic high value, pass transistors 342 and 343 are turned off, thereby substantially disconnecting the circuitry which generates sense amplifier control signals SA1, SA2, SA3 and SA#.

The latch formed by inverters 302 and 303 provide a logic high signal to an input terminal of NOR gate 332 and to the gate of n-channel transistor 345. As a result, NOR gate 332 generates a logic low signal which is provided to invertor 314. Invertor 314, in turn, provides a logic high signal to the gate of p-channel transistor 344. Transistor 344 is thereby turned off and transistor 345 is thereby turned on. The ground terminal coupled to transistor 345 causes a logic low signal to be provided to the latch formed by inverters 315 and 316. The logic high output signal is routed from this latch through invertor 317 and causes a logic low equalization signal EQ to be provided to equalization line 15. Thus, the equalization signal EQ is de-asserted low in response to the combination of a logic low RAS# signal and a rising edge of the system clock signal. As previously described, the logic low equalization signal EQ turns off equalization transistor 16 (FIG. 1).

The equalization signal EQ is also provided to the gates of n-channel transistors 351–353. When the equalization signal EQ goes low, these transistors 351–353 are turned off. This effectively disconnects sense amplifier control lines 33 and 34 in preparation of the operation of sense amplifier 50 (FIG. 1). Transistors 351–353 correspond to sense amplifier equalization transistor 51 (FIG. 1).

Row address decoding proceeds substantially in parallel with the generation of equalization signal EQ. The row address decoding is performed with conventional row address decoding circuitry (not shown) which operates in response to the RAS# signal.

When the system clock signal transitions to a logic low value after one half clock cycle, the transmission gate formed by transistors 340 and 341 is turned off and the transmission gate formed by transistors 342 and 343 is turned on. The latch formed by inverters 302 and 303 provides a logic low signal to the latch formed by inverters 304 and 305. The latch formed by inverters 304 and 305, in turn, provides a logic high sense amplifier control signal SA1 to the gate of n-channel transistor 346. In response, transistor 346 is turned on, thereby coupling sense amplifier control line 34 to the ground supply voltage.

The sense amplifier control signal SA1 is also provided to an input terminal of NAND gate 335 and to a delay chain formed by inverters 306–307 and MOS capacitor 347 (which is formed by connecting the drain and source of an MOS transistor to the ground voltage supply). The output signal of this delay chain is a logic high value which is provided to the other input terminal of NAND gate 335. NAND gate 335 provides a logic low output signal, which is routed through invertor 308 to create a logic high sense amplifier control signal SA2. Sense amplifier control signal SA2 is applied to the gate of n-channel transistor 349, thereby turning this transistor 349 on. As a result, sense amplifier control line 34 is coupled to the ground supply voltage through transistor 349.

Sense amplifier control signal SA2 is also provided to a delay chain which is formed by inverters 309–310 and MOS capacitor 348. The output terminal of this delay chain is a logic high signal which is provided to an input terminal of NAND gate 336. The other input terminal of NAND gate 336 is the logic high sense amplifier control signal SA1. In response to these input signals, NAND gate 336 provides a logic low output signal. This output signal is routed through invertor 311 as a logic high sense amplifier control signal SA3. Sense amplifier control signal SA3 is provided to the gate of n-channel transistor 350, thereby turning on this transistor 350. As a result, sense amplifier control line 34 is coupled to the ground supply voltage through transistor 350.

As previously discussed, the sense amplifier control signal SA described in connection with FIG. 1 actually consists of the three sense amplifier control signals SA1, SA2 and SA3. These control signals SA1, SA2 and SA3 are sequentially enabled to sequentially turn on respective transistors 346, 349 and 350. By sequentially turning on transistors 346, 349 and 350, the switching transient noise to the ground voltage supply is minimized.

NAND gate 337 receives the logic high sense amplifier control signals SA1 and SA3, and in response, provides a logic low output signal to series-connected inverters 312 and 313. Invertor 313 provides a logic low signal to p-channel transistor 354, thereby turning this transistor 354 on and providing the $V_{CC}$ supply voltage to sense amplifier control line 33. Because NAND gate 337 is operated in response to sense amplifier control signal SA3, sense amplifier control line 33 is connected to the $V_{cc}$ voltage supply a short time (e.g., approximately 2 nanoseconds) after sense amplifier control line 34 is connected to ground. This reduces the amount of current that may flow directly between the $V_{CC}$ and ground voltage supplies.

The previously described mode of operation for control circuit 300 is dependent upon the frequency of the system clock signal. This mode of operation is desirable during normal operation of memory array 100, when the system clock signal has a relatively high frequency (e.g., 66 to 100 Mhz). Wafer testing is typically performed at a relatively low frequency, for example, less than 10 Mhz. Some of the weaker memory cells may respond properly when tested at such a low frequency, but fail when operated at a high frequency, thereby adversely impacting the effectiveness of wafer testing and defect repair. Consequently, the control circuit 300 includes test circuitry which allows DRAM array 100 to be operated asynchronously when a low frequency system clock signal is applied during wafer testing. A test pad 370 is provided for the application of a TEST signal. As previously discussed, this TEST signal is a logic low value during normal operation of control circuit 300. A logic high TEST signal is asserted to enable the testing circuitry.

The logic high TEST signal turns on n-channel transistor 355 and forces the output signal of NOR gate 331 to a logic low level. The logic low output signal of NOR gate 331 turns on pass transistors 340 and 341, thereby allowing the RAS# signal to be transmitted through transistors 340 and 341 independent of the system clock signal. The logic low output signal of NOR gate 331 turns off pass transistors 342 and 343. As a result, the generation of sense amplifier control signals SA1, SA2, SA3 and SA# is initiated at the falling edge of the RAS# signal. When a logic low RAS# signal is asserted and routed through invertor 301 and pass transistors 340 and 341, a logic high signal is applied to the delay chain formed by inverters 318–320 and capacitor 360. The output signal of this delay chain is a logic low signal which is routed through transistor 355 to the latch formed by inverters 304 and 305. In response to this logic low signal, the sense amplifier control signals SA1, SA2, SA3 and SA# are generated in the manner previously described. The column decoding operation is performed in the same manner for the test mode and for normal operation. Circuit 300 therefore operates in an asynchronous manner when the test mode is enabled. This advantageously allows DRAM array to be tested at a lower frequency than the normal operating frequency.

Although the invention has been described in connection with several embodiments, it is understood that this invention is not limited to the embodiments disclosed, but is capable of various modifications which would be apparent to one of ordinary skill in the art. Thus, the invention is limited only by the following claims.

What is claimed is:

1. A method of operating a dynamic random access memory (DRAM) array, comprising the steps of:
    providing a clock signal having a first state and a second state;
    providing an access control signal, wherein the access control signal is asserted to initiate an access to the DRAM array;
    initiating a row address decoding operation, deactivating a bit line equalization circuit of the DRAM array and deactivating sense amplifier equalization circuit of the DRAM array in response to the clock signal undergoing a first transition from the first state to the second state while the access control signal is asserted;
    initiating a sense amplifier enabling operation in response to the clock signal undergoing a first transition from the second state to the first state while the access control signal is asserted; and
    initiating a column address decoding operation in response to the clock signal undergoing a second transition from the first state to the second state while the access control signal is asserted.

2. The method of claim 1, wherein the step of deactivating the bit line equalization circuit comprises the steps of:
    transmitting an equalization signal to the gate of a first equalization transistor which extends across two bit lines of the DRAM array; and
    turning the first equalization transistor off in response to the equalization signal, thereby disconnecting the two bit lines.

3. The method of claim 2, wherein the step of deactivating the sense amplifier equalization circuit comprises the steps of:
    transmitting the equalization signal to the gate of a second equalization transistor which extends across two terminals of a sense amplifier of the DRAM array; and
    turning the second equalization transistor off in response to the equalization signal, thereby disconnecting the terminals of the sense amplifier.

4. The method of claim 1, wherein the row address decoding operation comprises the steps of:
    receiving a plurality of row address signals representative of a row address of the DRAM array;
    decoding the row address signals to determine the row address; and
    turning on a word line of the DRAM array which corresponds to the row address.

5. The method of claim 1, wherein the deactivation of the bit line equalization circuit is completed before the row address decoding operation is completed.

6. The method of claim 5, wherein the deactivation of the bit line equalization circuit and the row address decoding operation are completed before the clock signal undergoes the first transition from the second state to the first state.

7. The method of claim 1, wherein the sense amplifier enabling operation comprises the steps of:
    coupling a first input terminal of a sense amplifier to a first voltage supply; and
    coupling a second input terminal of the sense amplifier to a second voltage supply.

8. The method of claim 7, wherein the step of coupling a first input terminal of the sense amplifier to a first voltage supply, comprises the step of sequentially enabling a plurality of transistors connected in parallel between the first input terminal of the sense amplifier and the first voltage supply.

9. The method of claim 1, wherein the sense amplifier enabling operation is completed before the clock signal undergoes the second transition from the first state to the second state.

10. The method of claim 1, wherein the first state is a logic high state and the second state is a logic low state.

11. The method of claim 1, wherein the first state is a logic low state and the second state is a logic high state.

12. The method of claim 1, wherein the clock signal is generated by a phase locked loop circuit in response to a system clock signal.

13. The method of claim 12, wherein the system clock signal and the clock signal each have rising and falling edges, wherein the edges of the clock signal have a predetermined phase relationship with respect to the edges of the system clock signal.

14. The method of claim 1, further comprising the steps of:
    providing a test signal having a first state and a second state;
    performing the steps recited in claim 1 when the test signal is in the first state; and
    initiating the row address decoding operation, deactivating the bit line equalization circuit, deactivating the sense amplifier equalization circuit, enabling the sense amplifier, and enabling the column address decoding operation in a self-timed manner, independent of the clock signal, when the test signal is in the second state.

15. A control circuit for controlling a dynamic random access memory (DRAM) array having a plurality of bit line equalization circuits, a plurality of sense amplifiers, and a plurality of sense amplifier equalization circuits, the control circuit comprising:
    a clock input terminal for receiving a clock signal having a first state and a second state;
    an access control signal terminal for receiving an access control signal;
    a first signal generation circuit which generates an equalization signal when the access control signal is asserted and the clock signal undergoes a transition from the first state to the second state, wherein the equalization signal disables the bit line equalization circuits and the sense amplifier equalization circuits; and
    a second signal generation circuit which generates a sense amplifier control signal when the access control signal is asserted and the clock signal undergoes a transition from the second state to the first state, wherein the sense amplifier control signal enables the sense amplifiers.

16. The control circuit of claim 15, further comprising:
    a test input terminal for receiving a test signal; and
    a test circuit coupled to the test input terminal, wherein the test circuit is enabled when the test signal is asserted, and wherein the enabled test circuit decouples the clock signal from the first and second signal generation circuits, thereby allowing the first and second signal generation circuits to operate asynchronously in response to the access control signal.

17. A control circuit for controlling a row address decoding operation, deactivation of a bit line equalization circuit, deactivation of a sense amplifier equalization circuit, a sense amplifier enabling operation and a column address decoding operation of a dynamic random access memory (DRAM) array, the control circuit comprising:

a clock input terminal for receiving a clock signal having a plurality of clock edges;

an access control signal terminal for receiving an access control signal;

means for initiating the row address decoding operation in response to the access control signal and a first edge of the clock signal;

means for deactivating the bit line equalization circuit in response to the access control signal and the first edge of the clock signal;

means for deactivating the sense amplifier equalization circuit in response to the access control signal and the first edge of the clock signal;

means for initiating the sense amplifier enabling operation in response to the access control signal and a second edge of the clock signal; and means for initiating the column address decoding operation in response to the access control signal and a third edge of the clock signal.

18. A method of operating a dynamic random access memory (DRAM) array, comprising the steps of:

providing a clock signal having a first state and a second state;

providing an access control signal, wherein the access control signal is asserted to initiate an access to the DRAM array;

initiating a row address decoding operation, deactivating a bit line equalization circuit of the DRAM array and deactivating sense amplifier equalization circuit of the DRAM array when the access control signal is asserted and the clock signal undergoes a first transition from the first state to the second state;

initiating a sense amplifier enabling operation when the access control signal is asserted and the clock signal undergoes a first transition from the second state to the first state, the sense amplifier enabling operation comprising the steps of coupling a first input terminal of a sense amplifier to a first voltage supply, and coupling a second input terminal of the sense amplifier to a second voltage supply; and initiating a column address decoding operation when the access control signal is asserted and the clock signal undergoes a second transition from the first state to the second state.

19. The method of claim 18, wherein the step of coupling a first input terminal of the sense amplifier to a first voltage supply, comprises the step of sequentially enabling a plurality of transistors connected in parallel between the first input terminal of the sense amplifier and the first voltage supply.

20. A method of operating a dynamic random access memory (DRAM) array, comprising the steps of:

providing a clock signal having a first state and a second state, wherein the clock signal is generated by a phase locked loop circuit in response to a system clock signal;

providing an access control signal, wherein the access control signal is asserted to initiate an access to the DRAM array;

initiating a row address decoding operation, deactivating a bit line equalization circuit of the DRAM array and deactivating sense amplifier equalization circuit of the DRAM array when the access control signal is asserted and the clock signal undergoes a first transition from the first state to the second state;

initiating a sense amplifier enabling operation when the access control signal is asserted and the clock signal undergoes a first transition from the second state to the first state; and initiating a column address decoding operation when the access control signal is asserted and the clock signal undergoes a second transition from the first state to the second state.

21. The method of claim 20, wherein the system clock signal and the clock signal each have rising and falling edges, wherein the edges of the clock signal have a predetermined phase relationship with respect to the edges of the system clock signal.

22. A method of operating a dynamic random access memory (DRAM) array, comprising the steps of:

(a) providing a clock signal having a first state and a second state;

(b) providing an access control signal, wherein the access control signal is asserted to initiate an access to the DRAM array;

(c) initiating a row address decoding operation, deactivating a bit line equalization circuit of the DRAM array and deactivating sense amplifier equalization circuit of the DRAM array when the access control signal is asserted and the clock signal undergoes a first transition from the first state to the second state;

(d) initiating a sense amplifier enabling operation when the access control signal is asserted and the clock signal undergoes a first transition from the second state to the first state;

(e) initiating a column address decoding operation when the access control signal is asserted and the clock signal undergoes a second transition from the first state to the second state;

(f) providing a test signal having a first state and a second state;

(g) performing steps (a)–(e) claim 1 when the test signal is in the first state; and (h) initiating the row address decoding operation, deactivating the bit line equalization circuit, deactivating the sense amplifier equalization circuit, enabling the sense amplifier, and enabling the column address decoding operation in a self-timed manner, independent of the clock signal, when the test signal is in the second state.

23. A control circuit for controlling a dynamic random access memory (DRAM) array having a plurality of bit line equalization circuits, a plurality of sense amplifiers, and a plurality of sense amplifier equalization circuits, the control circuit comprising:

a clock input terminal for receiving a clock signal having a first state and a second state;

an access control signal terminal for receiving an access control signal;

a first signal generation circuit which generates an equalization signal when the access control signal is asserted and the clock signal undergoes a transition from the first state to the second state, wherein the equalization signal disables the bit line equalization circuits and the sense amplifier equalization circuits;

a second signal generation circuit which generates a sense amplifier control signal when the access control signal is asserted and the clock signal undergoes a transition from the second state to the first state, wherein the sense amplifier control signal enables the sense amplifiers;

a test input terminal for receiving a test signal; and a test circuit coupled to the test input terminal, wherein the test circuit is enabled when the test signal is asserted, and wherein the enabled test circuit decouples the clock signal from the first and second signal generation circuits, thereby allowing the first and second signal generation circuits to operate asynchronously in response to the access control signal.

* * * * *